(12) United States Patent
Ogawa et al.

(10) Patent No.: US 11,437,350 B2
(45) Date of Patent: *Sep. 6, 2022

(54) SEMICONDUCTOR DEVICE

(71) Applicant: UltraMemory Inc., Tokyo (JP)

(72) Inventors: Naoki Ogawa, Tokyo (JP); Toshitugu Ueda, Tokyo (JP); Kazuo Yamaguchi, Tokyo (JP)

(73) Assignee: ULTRAMEMORY INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/158,774

(22) Filed: Jan. 26, 2021

(65) Prior Publication Data

US 2021/0151415 A1    May 20, 2021

Related U.S. Application Data

(63) Continuation of application No. 16/595,979, filed on Oct. 8, 2019, now Pat. No. 10,937,765, which is a
(Continued)

(51) Int. Cl.
*G11C 16/04* (2006.01)
*H01L 25/065* (2006.01)
(Continued)

(52) U.S. Cl.
CPC .......... *H01L 25/0657* (2013.01); *G11C 5/063* (2013.01); *H01L 23/48* (2013.01);
(Continued)

(58) Field of Classification Search
CPC ... H01L 25/0657; H01L 23/48; H01L 23/498; H01L 23/065; H01L 25/07; H01L 25/18; H01L 27/108; H01L 28/10; G11C 5/025
See application file for complete search history.

(56) References Cited

U.S. PATENT DOCUMENTS 5,629,838 A    5/1997    Knight et al.
7,994,623 B2   8/2011    Nonomura et al.
(Continued)

FOREIGN PATENT DOCUMENTS

CN    101350345 A    1/2009
JP    2005228981 A   8/2005
(Continued)

OTHER PUBLICATIONS

Office Action issued in corresponding CN Patent Application No. 201680081551.2, dated Feb. 3, 2021 (5 pages).
(Continued)

*Primary Examiner* — Pho M Luu
(74) *Attorney, Agent, or Firm* — Muncy, Geissler, Olds & Lowe, P.C.

(57) ABSTRACT

A semiconductor device includes a plurality of memory chips laminated to each other, each of the memory chips include a first transmission/reception coil for communication by means of inductive coupling; first lead-out lines led out from both ends of the first transmission/reception coil; and a first transmission/reception circuit, which is connected to the first lead-out lines, and which inputs/outputs signals to/from the first transmission/reception coil. The semiconductor device is also provided with an interposer, which is disposed on one end in the laminating direction of the memory chips, and which has, for each of the memory chips: a second transmission/reception coil coupled to the first transmission/reception coil by means of inductive coupling; second lead-out lines led out from both ends of the second transmission/reception coil; and a second transmission/reception circuit, which is connected to the second lead-out lines, and which inputs/outputs signals to/from the second transmission/reception coil.

7 Claims, 13 Drawing Sheets

Related U.S. Application Data continuation of application No. 16/077,270, filed as application No. PCT/JP2016/053939 on Feb. 10, 2016, now Pat. No. 10,483,242.

(51) Int. Cl.

| | | |
|---|---|---|
| *H01L 25/18* | (2006.01) | |
| *H01L 25/07* | (2006.01) | |
| *H01L 23/48* | (2006.01) | |
| *H01L 49/02* | (2006.01) | |
| *H04B 5/00* | (2006.01) | |
| *G11C 5/06* | (2006.01) | |
| *H04B 5/02* | (2006.01) | |
| *H01L 23/498* | (2006.01) | |
| *H01L 23/64* | (2006.01) | |
| *H01L 27/108* | (2006.01) | |
| *G11C 5/02* | (2006.01) | |

(52) U.S. Cl.
CPC .......... *H01L 23/498* (2013.01); *H01L 23/645* (2013.01); *H01L 25/065* (2013.01); *H01L 25/07* (2013.01); *H01L 25/18* (2013.01); *H01L 27/108* (2013.01); *H01L 28/10* (2013.01); *H04B 5/0081* (2013.01); *H04B 5/02* (2013.01); *G11C 5/025* (2013.01)

(56) References Cited

U.S. PATENT DOCUMENTS

| | | | |
|---|---|---|---|
| 8,735,288 B2 | 5/2014 | Ltaya et al. | |
| 9,589,887 B2 | 3/2017 | Watanabe et al. | |
| 10,115,684 B2 | 10/2018 | Watanabe et al. | |
| 10,483,242 B2 * | 11/2019 | Ogawa | H01L 25/18 |
| 10,937,765 B2 * | 3/2021 | Ogawa | H01L 25/065 |
| 2007/0289772 A1 | 12/2007 | Kuroda et al. | |
| 2009/0021974 A1 | 1/2009 | Nonomura et al. | |
| 2009/0233546 A1 | 9/2009 | Sasaki et al. | |
| 2010/0040893 A1 | 2/2010 | Yagihashi et al. | |
| 2010/0254481 A1 | 10/2010 | Nakagawa | |
| 2011/0089973 A1 | 4/2011 | Kondo | |
| 2011/0156488 A1 | 6/2011 | Kuroda | |
| 2012/0126427 A1 | 5/2012 | Sasaki et al. | |
| 2015/0145116 A1 | 5/2015 | Uzoh et al. | |
| 2015/0171065 A1 | 6/2015 | Guzek et al. | |
| 2017/0148751 A1 | 5/2017 | Watanabe et al. | |
| 2020/0013745 A1 * | 1/2020 | Lee | H01L 24/17 |
| 2020/0035590 A1 | 1/2020 | Tsai et al. | |
| 2020/0084880 A1 | 3/2020 | Ooi et al. | |
| 2021/0083122 A1 * | 3/2021 | Naylor | H01L 27/11597 |

FOREIGN PATENT DOCUMENTS

| | | |
|---|---|---|
| JP | 2007313594 A | 12/2007 |
| JP | 2009026792 A | 2/2009 |
| JP | 2009295699 A | 12/2009 |
| JP | 2010045260 A | 2/2010 |
| JP | 2011081883 A | 4/2011 |
| JP | 2012109523 A | 6/2012 |
| WO | WO-2007029435 A1 | 3/2007 |
| WO | WO-2009035028 A1 | 3/2009 |

OTHER PUBLICATIONS

Notification of Reasons for Refusal issued in corresponding JP Patent Application No. 2020-067088, dated Mar. 9, 2021 (3 pages).

* cited by examiner

SEMICONDUCTOR DEVICE

CROSS-REFERENCE TO RELATED APPLICATIONS

This application is a Continuation of co-pending application Ser. No. 16/595,979, filed on Oct. 8, 2019, and which issued as U.S. Pat. No. 10,937,765 on Mar. 2, 2021, which is a Continuation of application Ser. No. 16/077,270, filed on Aug. 10, 2018, and which issued as U.S. Pat. No. 10,483,242 on Nov. 19, 2019 which is a 371 of international application PCT/JP2016/053939, filed on Feb. 10, 2016, for which priority is claimed under 35 U.S.C. § 120, the entire contents of all of which are hereby incorporated by reference.

TECHNICAL FIELD

The present invention relates to a semiconductor device and more particularly, to a laminated semiconductor device in which semiconductor chips are laminated.

BACKGROUND ART

A plurality of semiconductor chips are three-dimensionally laminated in order to meet a demand for a large scale integration (LSI) circuit with a high degree of integration and high capacity.

One of the three-dimensional mounting techniques is a through-silicon-via (TSV) technique. In this method, a fine hole is provided in a semiconductor chip, a through electrode is formed, and chips are vertically connected to each other by the through electrode. However, the TSV requires a machining technique. Therefore, a manufacturing cost per chip is high and, for example, a mechanical connection failure occurs due to stress or heat.

Another method of the three-dimensional mounting technique is a technique (ThruChip Interface, TCI) using inductive coupling. In the TCI, data communication is performed between the laminated chips using inductive coupling between a transmission coil and a reception coil (for example, see Patent Document 1).

In the TCI, an inductive coupling interface between the laminated chips is formed by inductive coupling between the transmission/reception coils and a transmission/reception circuit for processing data communication. A transmission circuit converts transmission data into a current. In a case in which the converted transmission current flows to the transmission coil, a received voltage is induced in the reception coil according to a change in the transmission current. Then, an induced voltage is detected by the reception circuit and the transmission data is restored. In the TCI, the transmission/reception coil is formed by a metal wire in a semiconductor integrated circuit manufacturing process and does not require a machining technique. Therefore, the TCI is superior in cost to the TSV and can solve a reliability problem caused by mechanical connection.

Patent Document 1: Japanese Unexamined Patent Application, Publication No. 2005-228981

DISCLOSURE OF THE INVENTION

Problems to be Solved by the Invention

It is necessary to further improve the degree of integration while reducing the size of a semiconductor integrated circuit in order to achieve a supercomputer with a high performance and low power consumption. The invention has been made in view of the above-mentioned problems. That is, an object of the invention is to provide a semiconductor device which is manufactured by a three-dimensional mounting technique using TCI and in which transmission/reception coils and transmission/reception circuits are disposed in each semiconductor chip with high efficiency to reduce the size and to improve the degree of integration.

Other objects and advantages of the invention will become apparent from the following description.

Means for Solving the Problems (1) An aspect of the invention relates to a semiconductor device including: a plurality of memory chips, that are laminated, each of which includes a first transmission/reception coil for communication using inductive coupling, a first lead-out line led out from both ends of the first transmission/reception coil, and a first transmission/reception circuit connected to the first lead-out line, being input and output signals between the first transmission/reception circuit and the first transmission/reception coil; and an interposer that is provided at one end in a direction in which the plurality of memory chips are laminated and includes, for each of the plurality of memory chips, a second transmission/reception coil which is coupled to the first transmission/reception coil by inductive coupling, a second lead-out line led out from both ends of each of the second transmission/reception coil, and a second transmission/reception circuit connected to the second lead-out line for inputting and outputting signals to and from the second transmission/reception coil, wherein the plurality of memory chips have a structure in which a plurality of the first transmission/reception circuits are disposed at positions that overlap each other in a plan view and the first transmission/reception coils are disposed in the vicinity of the first transmission/reception circuits at positions that do not overlap each other in a plan view.

(2) According to another aspect of the invention, in the semiconductor device according to (1), the first transmission/reception coils are symmetrically disposed in the vicinity of the first transmission/reception circuits in a plan view.

(3) According to still another aspect of the invention, in the semiconductor device according to (1), the first lead-out lines in the plurality of memory chips have the same length.

(4) According to yet another aspect of the invention, in the semiconductor device according to (1), central axes of the second transmission/reception coils are aligned with central axes of the corresponding first transmission/reception coils.

(5) According to still yet another aspect of the invention, in the semiconductor device according to (1), the second lead-out lines disposed in the interposer for each of the plurality of memory chips have the same length.

(6) According to yet still another aspect of the invention, in the semiconductor device according to (1), the interposer is a memory chip that is located at one end in the lamination direction among the plurality of memory chips which are laminated.

(7) According to still yet another aspect of the invention, in the semiconductor device according to (1), the plurality of memory chips are divided into a plurality of group units, and in the memory chips forming each group unit, the first transmission/reception coil is disposed at a position that overlap each other in a plan view, the first lead-out line is disposed at a position that overlap each other in a plan view, and the first transmission/reception circuit is disposed at positions that overlap each other in a plan view.

(8) According to yet still another aspect of the invention, in the semiconductor device according to (7), the memory chips include arithmetic circuits that output different identification numbers in each other and comparison circuits that compare the identification numbers with a memory chip selection address and detect whether the identification numbers are matched with the memory chip selection address. A signal line for the address is common to all of the memory chips.

(9) According to still yet another aspect of the invention, in the semiconductor device according to (8), the interposer generates the address and outputs the address.

Effects of the Invention

The invention provides a semiconductor device in which transmission/reception coils and transmission/reception circuits are disposed in each semiconductor chip with high efficiency to reduce a size and to improve the degree of integration.

PREFERRED MODE FOR CARRYING OUT THE INVENTION

Figure 1:
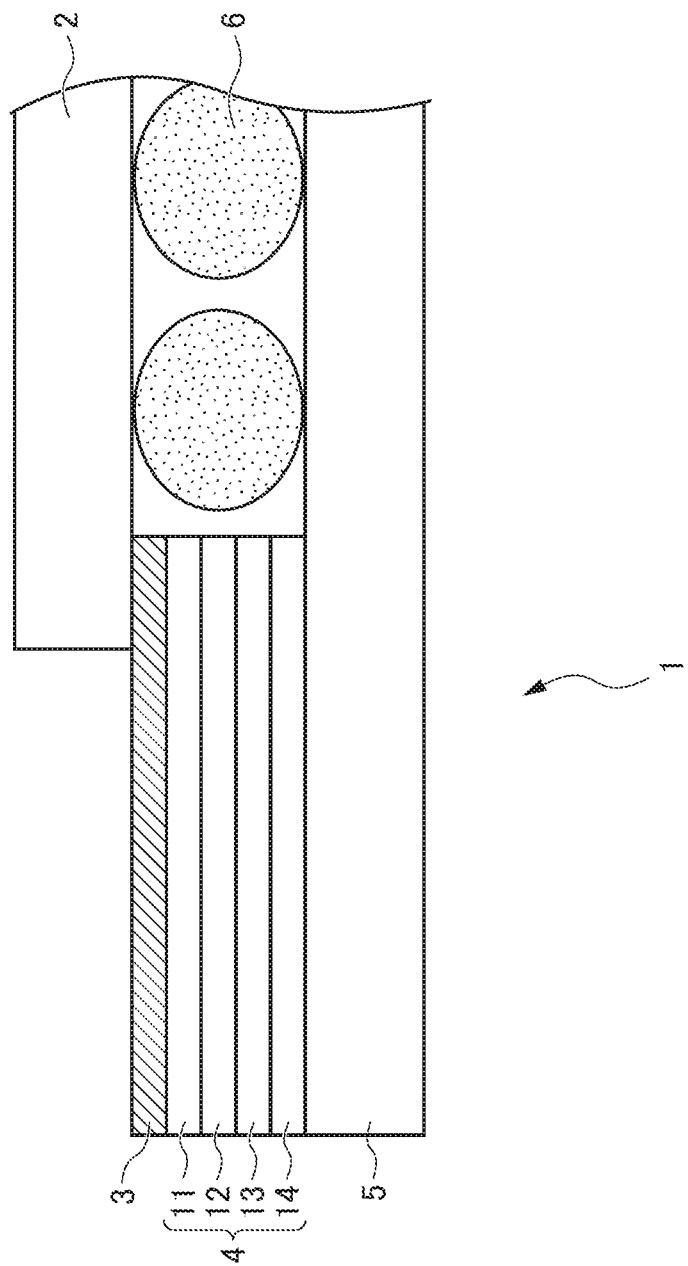
FIG. 1 is a partial cross-sectional view illustrating an example of a semiconductor device in Embodiment 1.

Embodiment 1. FIG. 1 is a partial cross-sectional view illustrating an example of a semiconductor device according to this embodiment. In a semiconductor device 1 illustrated in FIG. 1, a processor 2 is mounted on a substrate 5 through solder balls 6. In addition, a laminated structure (laminated DRAM 4) in which memory chips 11 to 14 of a dynamic random access memory (DRAM) are laminated in a direction perpendicular to the substrate 5 is provided on the substrate 5. An interposer 3 is provided at one end of the laminated DRAM 4 in the direction in which the memory chips are laminated, that is, on the memory chip 11. The provision of the interposer 3 makes it possible to prevent heat generated from the processor 2 from having an adverse effect on the operation of the DRAM. For example, the semiconductor device 1 may have a structure in which a plurality of structures, each of which includes the interposer 3 and the laminated DRAM 4, are disposed in the vicinity of the processor 2. The lamination is implemented by fusion bonding. The lamination may be implemented by a method using an adhesive or other methods including surface-activated room-temperature bonding.

The processor 2 is electrically connected to each of the memory chips 11 to 14 of the laminated DRAM 4 through the interposer 3. Specifically, the interposer 3 receives data transmitted from a chip of the processor 2 disposed on the upper side and transmits data to a predetermined memory chip of the laminated DRAM 4 disposed on the lower side. In this way, data is written. In contrast, data is read as follows. The interposer 3 receives data transmitted from a predetermined memory chip of the laminated DRAM 4 disposed on the lower side and transmits data to the chip of the processor 2 disposed on the upper side.

In the semiconductor device 1, for example, data may be transmitted from the processor 2 to one or more elements (not illustrated) and any one of the elements may transmit data to the interposer 3. The interposer 3 may not transmit the data received from the memory chips 11 to 14 to the processor 2, but may transmit the data to another element (not illustrated).

Figure 2:
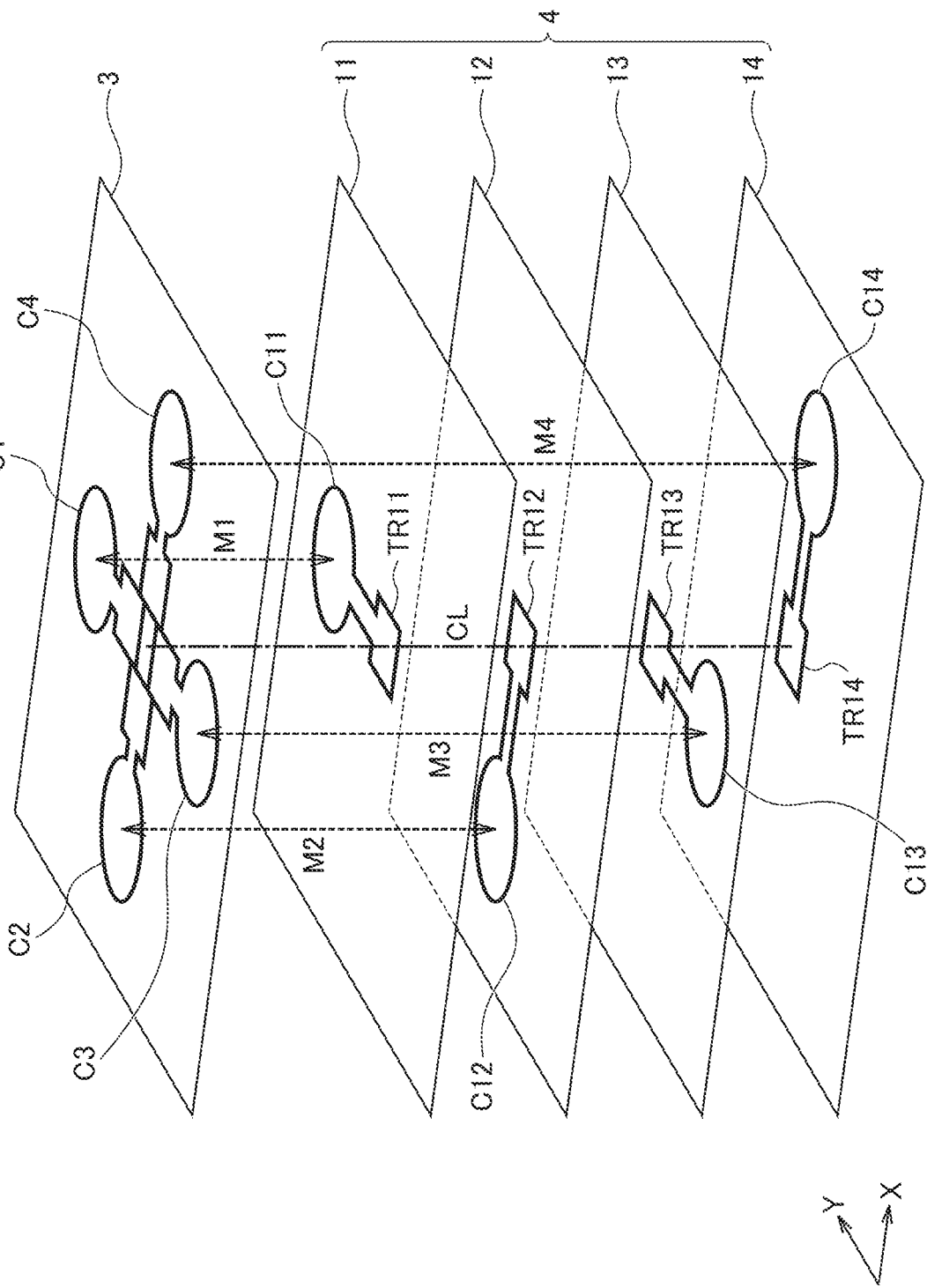
FIG. 2 is a perspective view schematically illustrating the structure of an interposer and a laminated DRAM in Embodiment 1.

FIG. 2 is a perspective view schematically illustrating the structure of the interposer 3 and the laminated DRAM 4 illustrated in FIG. 1. In the laminated DRAM 4, four DRAM memory chips 11 to 14 are laminated. The memory chips 11 to 14 include transmission/reception coils C11 to C14, respectively. The interposer 3 includes transmission/reception coils C1 to C4 corresponding to the transmission/reception coils C11 to C14 of the memory chips 11 to 14. Here, the transmission/reception coils C11 to C14 are a preferred example of a first transmission/reception coil according to the invention. In addition, the transmission/reception coils C1 to C4 are a preferred example of a second transmission/reception coil according to the invention. In this embodiment, the number of memory chips laminated is not limited to the example illustrated in FIGS. 1 and 2.

In the specification, a transmission coil and a reception coil are generically referred to as a transmission/reception coil. The transmission/reception coil can have, for example, a structure in which the center of the transmission coil and the center of the reception coil are coaxially positioned. The number of turns of the transmission/reception coil can be set to any value by using a plurality of wiring layers and connection vias. The structure of the transmission/reception coil is not limited to the above-mentioned example. For example, a one-turn transmission coil and a one-turn reception coil may be formed by a one-layer wire and may be connected to each other and the number of turns may be increased by a plurality of wiring layers and connection vias. In the actual semiconductor device, for example, about 1000 transmission/reception coils are disposed in one memory chip of the DRAM. A distance between the transmission/reception coils may be, for example, about half the size of the transmission/reception coil.

Inductive coupling between the transmission/reception coil C1 of the interposer 3 and the transmission/reception coil C11 of the memory chip 11 will be described with reference to FIG. 3. In this embodiment, the transmission/ reception coils (C1 to C4 and C11 to C14) have a circular shape in a plan view. However, the shape of the transmission/reception coils is not limited thereto and may be, for example, a polygon or an ellipse.

Figure 3:
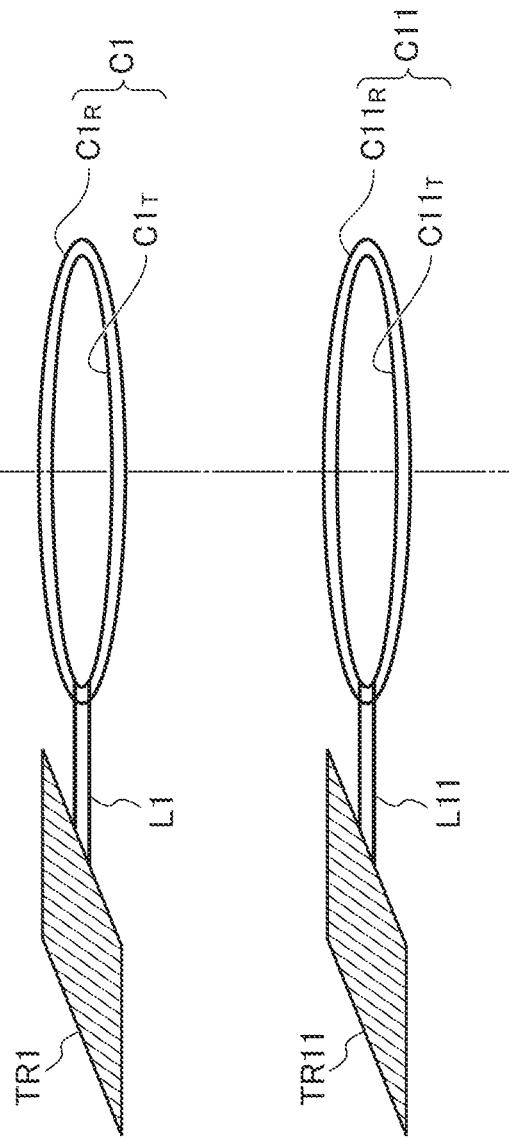
FIG. 3 is an example of a diagram schematically illustrating transmission/reception coils generating inductive coupling.

In the example illustrated in FIG. 3, the transmission/reception coil C1 is a double coil in which a reception coil $C1_R$ is provided outside the transmission coil $C1_T$ and the transmission coil $C1_T$ and the reception coil $C1_R$ are coaxially provided. Similarly, the transmission/reception coil C11 has a structure in which a reception coil $C11_R$ is provided outside a transmission coil $C11_T$. The transmission/reception coil C1 and the transmission/reception coil C11 are disposed such that the central axes indicated by a dotted line in FIG. 3 are aligned with each other.

Lead-out lines L1 are led out from both ends of the transmission/reception coil C1 and a transmission/reception circuit TR1 is connected to the lead-out lines L1. A signal is input and output between the transmission/reception circuit TR1 and the transmission/reception coil C1 as follows. The lead-out line L1 is a preferred example of a second lead-out line according to the invention. The transmission/reception circuit TR1 is a preferred example of a second transmission/reception circuit according to the invention.

The transmission/reception circuit TR1 outputs a superimposed current to the transmission coil $C1_T$ according to data transmitted to the memory chip 11. In a case in which a transmission current flows to the transmission coil $C1_T$, magnetic flux interlinked with the transmission coil $C1_T$ is generated. Since the generated magnetic flux is also interlinked with the reception coil $C11_R$ of the transmission/reception coil C11 in the memory chip 11, induced electromotive force is generated in the reception coil $C11_R$ and a received current flows to the reception coil $C11_R$.

Lead-out lines L11 are led out from both ends of the transmission/reception coil C11 and a transmission/reception circuit TR11 is connected to the lead-out lines L11. A signal is input and output between the transmission/reception circuit TR11 and the transmission/reception coil C11. Here, in a case in which the received current flows to the reception coil $C11_R$, the transmission/reception circuit TR11 reproduces data corresponding to the generated induced electromotive force. The lead-out line L11 is a preferred example of a first lead-out line according to the invention. The transmission/reception circuit TR11 is a preferred example of a first transmission/reception circuit according to the invention.

In this way, data output from the processor 2 is transmitted to the memory chip 11 of the laminated DRAM 4 through the interposer 3.

In contrast, in a case in which data is read from the memory chip 11, a transmitter of the transmission/reception circuit TR11 in the memory chip 11 outputs a superimposed current to the transmission coil $C11_T$ according to data transmitted to the interposer 3. In a case in which a transmission current flows to the transmission coil $C11_T$, magnetic flux interlinked with the transmission coil $C11_T$ is generated. Since the generated magnetic flux is also interlinked with the reception coil $C1_R$ of the transmission/reception coil C1 in the interposer 3, induced electromotive force is generated in the reception coil $C1_R$ and a received current flows to the reception coil $C1_R$. In a case in which the received current flows to the reception coil $C1_R$, the transmission/reception circuit TR1 electrically connected to the reception coil $C1_R$ reproduces data corresponding to the generated induced electromotive force. In this way, data output from the memory chip 11 of the laminated DRAM 4 is transmitted to the interposer 3.

Each of the other transmission/reception coils (C2 to C4) of the interposer and the transmission/reception coils (C12 to C14) of the other memory chips is provided with lead-out lines that are led out from both ends of the coil and a transmission/reception circuit that is connected to the lead-out lines. Signals are input and output between the transmission/reception circuit and the transmission/reception coil. Here, the lead-out lines provided in the transmission/reception coils (C2 to C4) are a preferred example of the second lead-out line according to the invention and the lead-out lines provided in the transmission/reception coils (C12 to C14) are a preferred example of the first lead-out line according to the invention. The transmission/reception circuits electrically connected to the transmission/reception coils (C2 to C4) are a preferred example of the second transmission/reception circuit according to the invention and the transmission/reception circuits electrically connected to the transmission/reception coils (C12 to C14) are a preferred example of the first transmission/reception circuit according to the invention.

In the semiconductor device 1, data is transmitted and received between the transmission/reception coil C2 and the transmission/reception coil C12, between the transmission/reception coil C3 and the transmission/reception coil C13, and between the transmission/reception coil C4 and the transmission/reception coil C14 by the same method as described above. In FIG. 2, M1 to M4 indicate magnetic flux generated between the coils. In this case, it is preferable that the central axes of the transmission/reception coils C1 to C4 of the interposer 3 be aligned with the central axes of the transmission/reception coils C11 to C14 of the corresponding memory chips, respectively. This configuration makes it possible to prevent a communication failure caused by the attenuation of the signal transmitted and received between the coils. In addition, it is possible to prevent an increase in power required for communication.

In this embodiment, the first transmission/reception circuits of a plurality of memory chips forming the laminated DRAM are disposed at the positions that overlap each other in a plan view. In contrast, the first transmission/reception coils of the memory chips are disposed in the vicinity of the first transmission/reception circuits at the positions that do not overlap each other in a plan view. In this case, it is preferable that the central axes of the second transmission/reception coils in the interposer be aligned with the central axes of the corresponding first transmission/reception coils as described above. It is preferable that the first transmission/reception coils be symmetrically disposed in a plan view. It is preferable that the lengths of the first lead-out lines in the memory chips be equal to each other.

FIGS. 4(A) to 4(D) are partial plan views schematically illustrating the memory chips 11 to 14. FIGS. 4(A) to 4(D) illustrate the transmission/reception coils C11 to C14 provided in the memory chips 11 to 14, the lead-out lines L11 to L14 led out from both ends of each of the transmission/reception coils, and the transmission/reception circuits TR11 to TR14 that are connected to the lead-out lines. Signals are input and output between the transmission/reception circuits TR11 to TR14 and the transmission/reception coils C11 to C14.

Figure 4A:
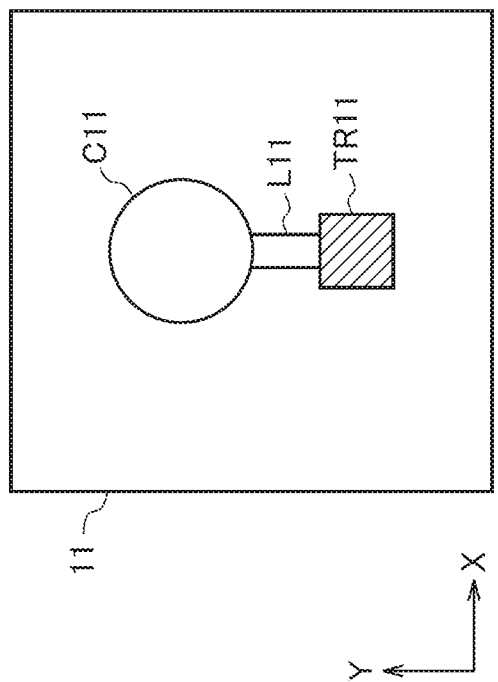
FIGS. 4(A) to 4(D) are partial plan views schematically illustrating memory chips in Embodiment 1.
Figure 4B:
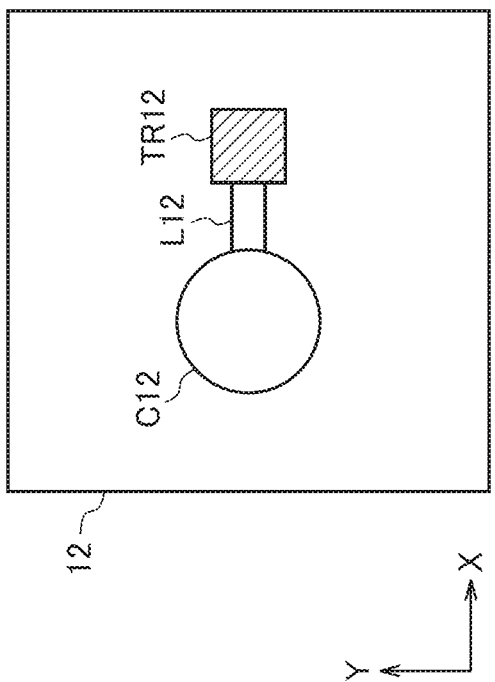
Figure 4C:
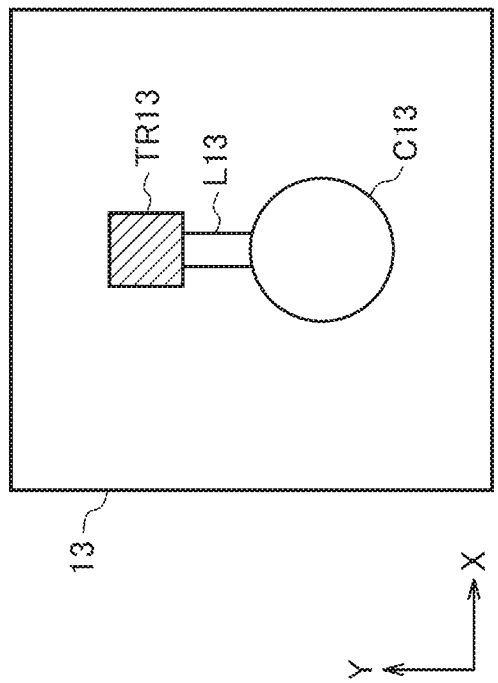
Figure 4D:
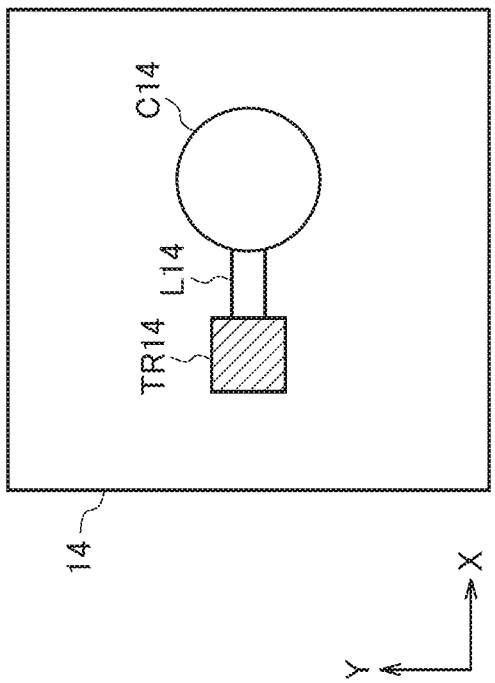

In the memory chip 11 illustrated in FIG. 4(A), the transmission/reception coil C11 and the transmission/reception circuit TR11 are arranged in the Y direction. The memory chip 13 illustrated in FIG. 4(C) has the same structure as the memory chip 11 except that the positional relationship between the transmission/reception coil C13 and the transmission/reception circuit TR13 is 180 degrees different from that illustrated in FIG. 4(A). In the memory chip 12 illustrated in FIG. 4(B), the transmission/reception coil C12 and the transmission/reception circuit TR12 are arranged in the X direction. The memory chip 14 illustrated in FIG. 4(D) has the same structure as the memory chip 12 except that the positional relationship between the transmission/reception coil C14 and the transmission/reception circuit TR14 is 180 degrees different from that illustrated in FIG. 4(B). The structure in which the memory chips 11 to 14 are laminated such that the transmission/reception circuits TR11 to TR14 overlap each other in a plan view is illustrated in FIG. 2. The transmission/reception circuits TR11 to TR14 are disposed at a common position in the memory chips 11 to 14, that is, a position represented by a dotted line CL in FIG. 2. This floor plan of the semiconductor device 1 makes it possible to provide a large number of transmission/reception circuits and transmission/reception coils in the memory chips 11 to 14 with high efficiency. Therefore, it is possible to reduce the size of the semiconductor device and to increase the degree of integration of the semiconductor device.

According to the structure illustrated in FIG. 2, in the plan view of the laminated DRAM 4, the transmission/reception coils C11 to C14 are disposed in the vicinity of the transmission/reception circuits TR11 to TR14 which overlap each other at the positions that do not overlap each other. In this case, it is preferable that the transmission/reception coils C11 to C14 be symmetrically disposed in a plan view as illustrated in FIG. 2. Since the transmission/reception coils C11 to C14 are disposed at the positions that do not overlap each other, the distance between the coils is long. Therefore, it is possible to reduce a received voltage of crosstalk in each transmission/reception coil and to prevent a signal voltage received from the corresponding transmission/reception coil of the interposer 3 from being affected by the received voltage. In addition, in a case in which the transmission/reception coils C11 to C14 are symmetrically disposed in a plan view, it is possible to dispose a large number of transmission/reception coils which are not limited to the transmission/reception coils C11 to C14 in each of the memory chips 11 to 14 with high efficiency. In the specification, the symmetry means line symmetry, point symmetry, or both line symmetry and point symmetry. For example, in FIG. 2, the transmission/reception coils C11 to C14 are line-symmetrically and point-symmetrically disposed in a plan view.

As illustrated in FIGS. 4(A) to 4(D), it is preferable that the lengths of the lead-out lines L11 to L14 be equal to each other. In a case in which the lengths of the lead-out lines L11 to L14 are different from each other, the resistance values of the lead-out lines L11 to L14 are different from each other, which causes a difference between the degrees of attenuation of the signals input and output between the transmission/reception coils C11 to C14 and the transmission/reception circuits TR11 to TR14. In a case in which the lengths of the lead-out lines L11 to L14 are equal to each other, it is possible to input and output signals with the same level in any combination of the transmission/reception coils and the transmission/reception circuits.

Figure 5:
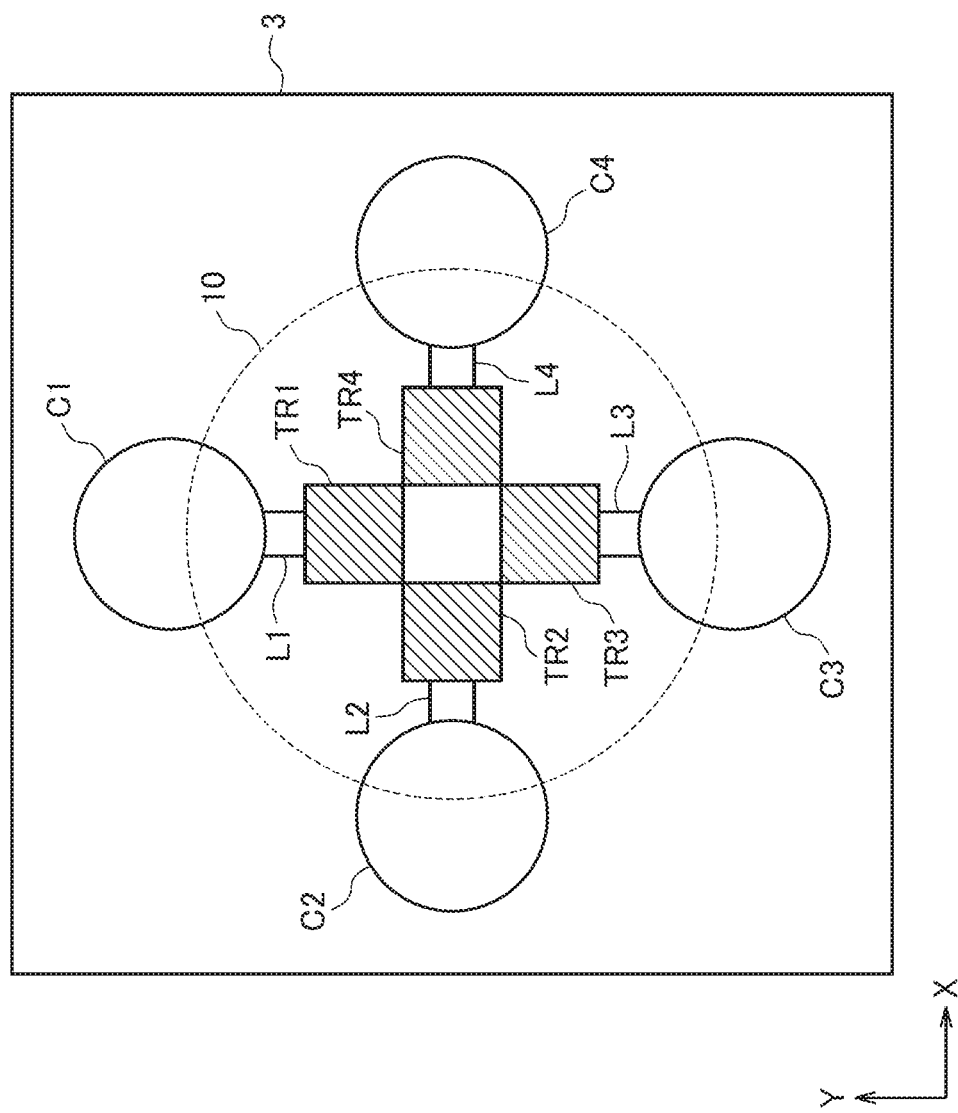
FIG. 5 is a partial plan view schematically illustrating the interposer in Embodiment 1.

FIG. 5 is a partial plan view schematically illustrating the interposer 3. FIG. 5 illustrates the transmission/reception coils C1 to C4, the lead-out lines L1 to L4 led out from both ends of each of the transmission/reception coils, and the transmission/reception circuits TR1 to TR4 that are connected to the lead-out lines. Signals are input and output between the transmission/reception circuits TR1 to TR4 and the transmission/reception coils C1 to C4. Here, in a case in which the transmission/reception coil C1, the lead-out line L1, and the transmission/reception circuit TR1 form a group and the other transmission/reception coils C2 to C4, the other lead-out lines L2 to L4, and the other transmission/reception circuits TR2 to TR4 are grouped in the same way, it is possible to form four groups of the transmission/reception coils, the lead-out lines, and the transmission/reception circuits. The components are disposed on the circumference of a circle 10 with an appropriate size such that the transmission/reception circuits TR1 to TR4 are symmetrically disposed inside the circle 10 and the transmission/reception coils C1 to C4 are symmetrically disposed outside the circle 10 as illustrated in FIG. 5. In this case, it is preferable that the central axes of the transmission/reception coils C1 to C4 be aligned with the central axes of the transmission/reception coils C11 to C14 of the corresponding memory chips as described above.

In addition, it is preferable that the lead-out lines L1 to L4 of the interposer 3 have the same length. In a case in which the lead-out lines L1 to L4 have different lengths, the resistance values of the lead-out lines L1 to L4 are different from each other, which causes a difference between the degrees of attenuation of the signal input and output between the transmission/reception coils C1 to C4 and the transmission/reception circuits TR1 to TR4. In a case in which the lengths of the lead-out lines L1 to L4 are equal to each other, it is possible to input and output signals with the same level in any combination of the transmission/reception coils and the transmission/reception circuits.

In FIGS. 2 and 5, the transmission/reception circuits TR1 to TR4 of the interposer 3 are disposed at the positions that do not overlap each other. However, this embodiment is not limited thereto. For example, one transmission/reception circuit may be provided at the center of the circle 10 illustrated in FIG. 5 and the transmission/reception circuit may be configured so as to have four circuit portions corresponding to the transmission/reception coils C1 to C4 and a circuit portion common to the transmission/reception coils C1 to C4.

Figure 6:
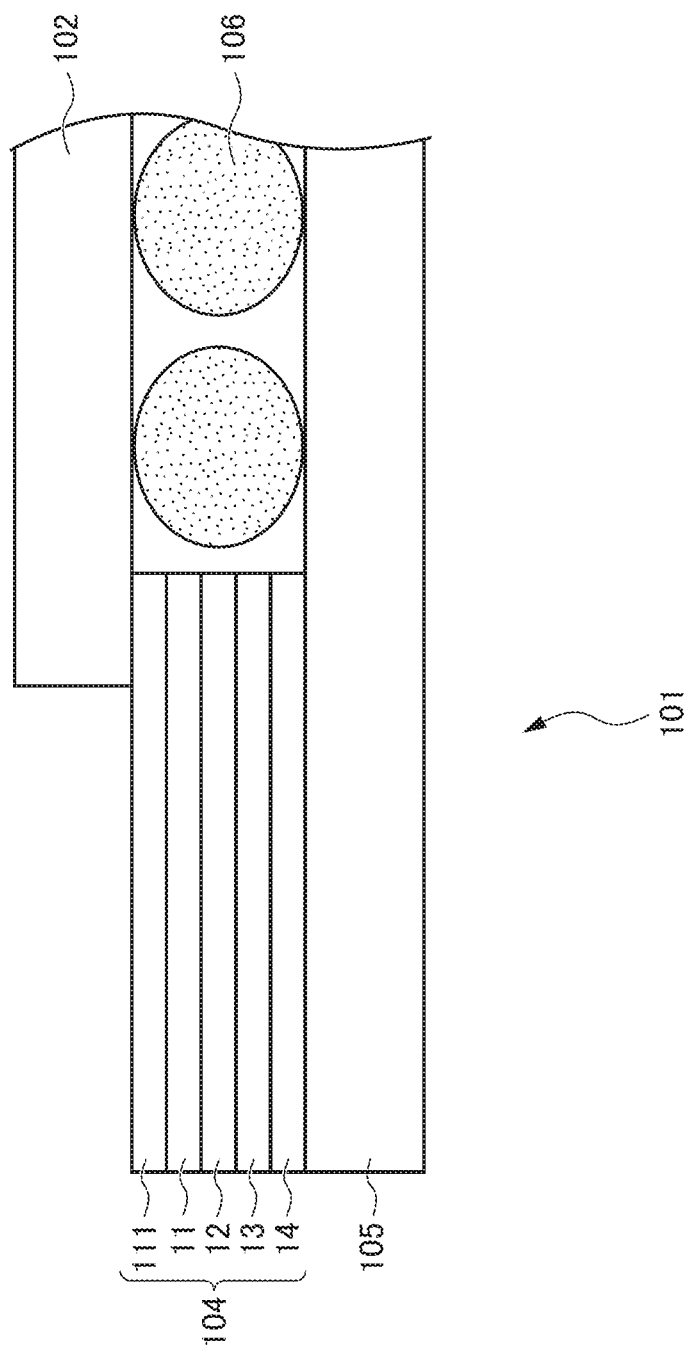
FIG. 6 is a partial cross-sectional view illustrating an example of a semiconductor device in Embodiment 2.

Embodiment 2. FIG. 6 is a partial cross-sectional view illustrating an example of a semiconductor device according to this embodiment. In a semiconductor device 101 illustrated in FIG. 6, a processor 102 is mounted on a substrate 105 through solder balls 106. In addition, a laminated DRAM 104 in which five memory chips 111 and 11 to 14 of a dynamic random access memory (DRAM) are laminated in a direction perpendicular to the substrate 105 is provided on the substrate 105.

Figure 7:
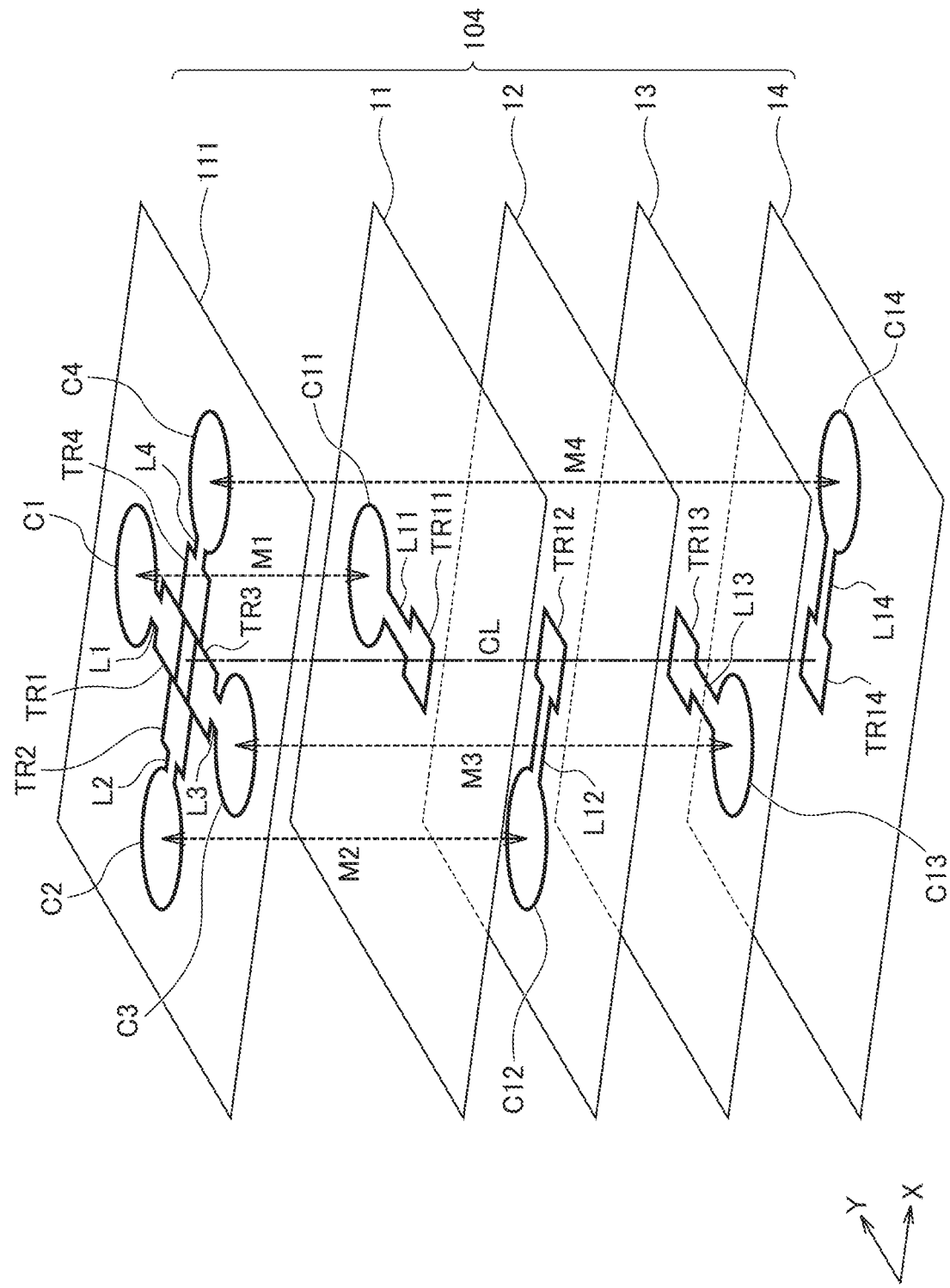
FIG. 7 is a cross-sectional view schematically illustrating a laminated DRAM in Embodiment 2.

FIG. 7 is a perspective view schematically illustrating the laminated DRAM 104. In FIG. 7, components denoted by the same reference numerals as those illustrated in FIG. 2 have the same structures. In the laminated DRAM 104, four memory chips 11 to 14 are laminated below the memory chip 111. However, the number of chips laminated below the memory chip 111 is not limited thereto.

The memory chip 111 provided in the uppermost layer of the laminated DRAM 104 has the original functions of the memory chip and also functions as an interposer. According to this structure, the interposer does not need to be provided separately from the laminated DRAM. Therefore, it is possible to reduce the overall thickness of a laminated body provided on the substrate 105.

Since the memory chip 111 functions as the interposer, the memory chip 111 includes transmission/reception coils C1 to C4 corresponding to transmission/reception coils C11 to C14 of the memory chips 11 to 14 of each DRAM. The transmission/reception coils C11 to C14 and the transmission/reception coils C1 to C4 correspond to first transmission/reception coils and second transmission/reception coils according to the invention, respectively, similarly to the transmission/reception coils C11 to C14 and the transmission/reception coils C1 to C4 described in Embodiment 1.

Lead-out lines (L1 to L4 and L11 to L14) are led out from both ends of each of the transmission/reception coils (C1 to C4) of the memory chip 111 and the transmission/reception coils (C11 to C14) of the other memory chips 11 to 14. In addition, transmission/reception circuits (TR1 to TR4 and TR11 to TR14) are connected to the lead-out lines and signals are input and output between the transmission/reception circuits and the corresponding transmission/reception coils. Here, the lead-out lines L1 to L4 are a preferred example of the second lead-out line according to the invention and the lead-out lines L11 to L14 are a preferred example of the first lead-out line according to the invention. The transmission/reception circuits TR1 to TR4 are a preferred example of the second transmission/reception circuit according to the invention and the transmission/reception circuits TR11 to TR14 are a preferred example of the first transmission/reception circuit according to the invention.

As illustrated in FIG. 7, electromagnetic coupling is generated between the transmission/reception coil C1 and the transmission/reception coil C11 by magnetic flux represented by an arrow M1 and data is transmitted and received by the electromagnetic coupling. In addition, electromagnetic coupling is generated between the transmission/reception coil C2 and the transmission/reception coil C12 by magnetic flux represented by an arrow M2. Electromagnetic coupling is generated between the transmission/reception coil C3 and the transmission/reception coil C13 by magnetic flux represented by an arrow M3. Electromagnetic coupling is generated between the transmission/reception coil C4 and the transmission/reception coil C14 by magnetic flux represented by an arrow M4. Data is transmitted and received by the electromagnetic coupling. In this case, it is preferable that the central axes of the transmission/reception coils C1 to C4 of the memory chip 111 be aligned with the central axes of the transmission/reception coils C11 to C14 of the corresponding memory chips. In this case, it is possible to prevent a communication failure caused by the attenuation of the signal transmitted and received between the coils. In addition, it is possible to prevent an increase in power required for communication.

The transmission/reception circuits TR11 to TR14 of the memory chips 11 to 14 are disposed at the positions that overlap each other in a plan view. That is, the transmission/reception circuits TR11 to TR14 are disposed at a common position in the memory chips 11 to 14, specifically, a position represented by a dotted line CL in FIG. 7. In contrast, the transmission/reception coils C11 to C14 of the memory chips 11 to 14 are disposed in the vicinity of the transmission/reception circuits TR11 to TR14 at the positions that do not overlap each other in a plan view. In this case, it is preferable that the central axes of the transmission/reception coils C1 to C4 of the memory chip 111 be aligned with the central axes of the transmission/reception coils C11 to C14 of the corresponding memory chips 11 to 14 as described above. It is preferable that the transmission/reception coils C11 to C14 be symmetrically disposed in a plan view. It is preferable that the lengths L11 to L14 of the lead-out lines in the memory chips 11 to 14 be equal to each other.

This floor plan of the semiconductor device 101 makes it possible to provide a large number of transmission/reception circuits and transmission/reception coils in the memory chips 11 to 14 with high efficiency. Therefore, it is possible to reduce the size of the semiconductor device and to increase the degree of integration of the semiconductor device. Since the transmission/reception coils C11 to C14 are disposed at the positions that do not overlap each other, the distance between the coils is long. Therefore, it is possible to reduce a received voltage of crosstalk in each transmission/reception coil and to prevent a signal voltage received from the corresponding transmission/reception coil of the memory chip 111 from being affected by the received voltage. In addition, in a case in which the transmission/reception coils C11 to C14 are symmetrically disposed in a plan view, it is possible to dispose a large number of transmission/reception coils which are not limited to the transmission/reception coils C11 to C14 in the memory chips 11 to 14 with high efficiency. Furthermore, since the lengths of the lead-out lines L11 to L14 are equal to each other, signals with the same level can be input and output between the transmission/reception coil C11 and the transmission/reception circuit TR11, between the transmission/reception coil C12 and the transmission/reception circuit TR12, between the transmission/reception coil C13 and the transmission/reception circuit TR13, and between the transmission/reception coil C14 and the transmission/reception circuit TR14.

The floor plan of the memory chip 111 functioning as the interposer is the same as the floor plan of the interposer 3 described with reference to FIG. 5 in Embodiment 1. That is, in a case in which the transmission/reception coil C1, the lead-out line L1, and the transmission/reception circuit TR1 of the memory chip 111 form a group and the other transmission/reception coils C2 to C4, the other lead-out lines L1 to L4, and the other transmission/reception circuits TR2 to TR4 are grouped in the same way, it is possible to form four groups of the transmission/reception coils, the lead-out lines, and the transmission/reception circuits. The components are disposed on the circumference of a circle with an appropriate size such that the transmission/reception circuits TR2 to TR4 are symmetrically disposed inside the circle and the transmission/reception coils C1 to C4 are symmetrically disposed outside the circle as illustrated in FIG. 7. In this case, it is preferable that the central axes of the transmission/reception coils C1 to C4 be aligned with the central axes of the transmission/reception coils C11 to C14 of the corresponding memory chips as described above.

In addition, it is preferable that the lead-out lines L1 to L4 of the memory chip 111 have the same length. In a case in which the lead-out lines L1 to L4 have different lengths, the resistance values of the lead-out lines L1 to L4 are different from each other, which causes a difference between the degrees of attenuation of the signals input and output between the transmission/reception coils C1 to C4 and the transmission/reception circuits TR1 to TR4. In a case in which the lengths of the lead-out lines L1 to L4 are equal to each other, it is possible to input and output signals with the same level in any combination of the transmission/reception coils and the transmission/reception circuits.

In FIG. 7, the transmission/reception circuits TR1 to TR4 of the memory chip 111 are disposed at the positions that do not overlap each other. However, this embodiment is not limited thereto. For example, one transmission/reception circuit may be provided at the center of the circle. In this case, the transmission/reception circuit may have four circuit portions corresponding to the transmission/reception coils C1 to C4 and a circuit portion common to the transmission/reception coils C1 to C4.

Embodiment 3. A semiconductor device according to this embodiment can have a structure in which a processor is mounted on a substrate through solder balls as in FIG. 1 described in Embodiment 1. A laminated structure (laminated DRAM) in which memory chips of each dynamic random access memory (DRAM) are laminated in a direction perpendicular to the substrate is provided on the substrate. In addition, an interposer is disposed at one end of the laminated DRAM in the direction in which the memory chips are laminated. The processor and the DRAM are electrically connected to each other through the interposer.

Figure 8:
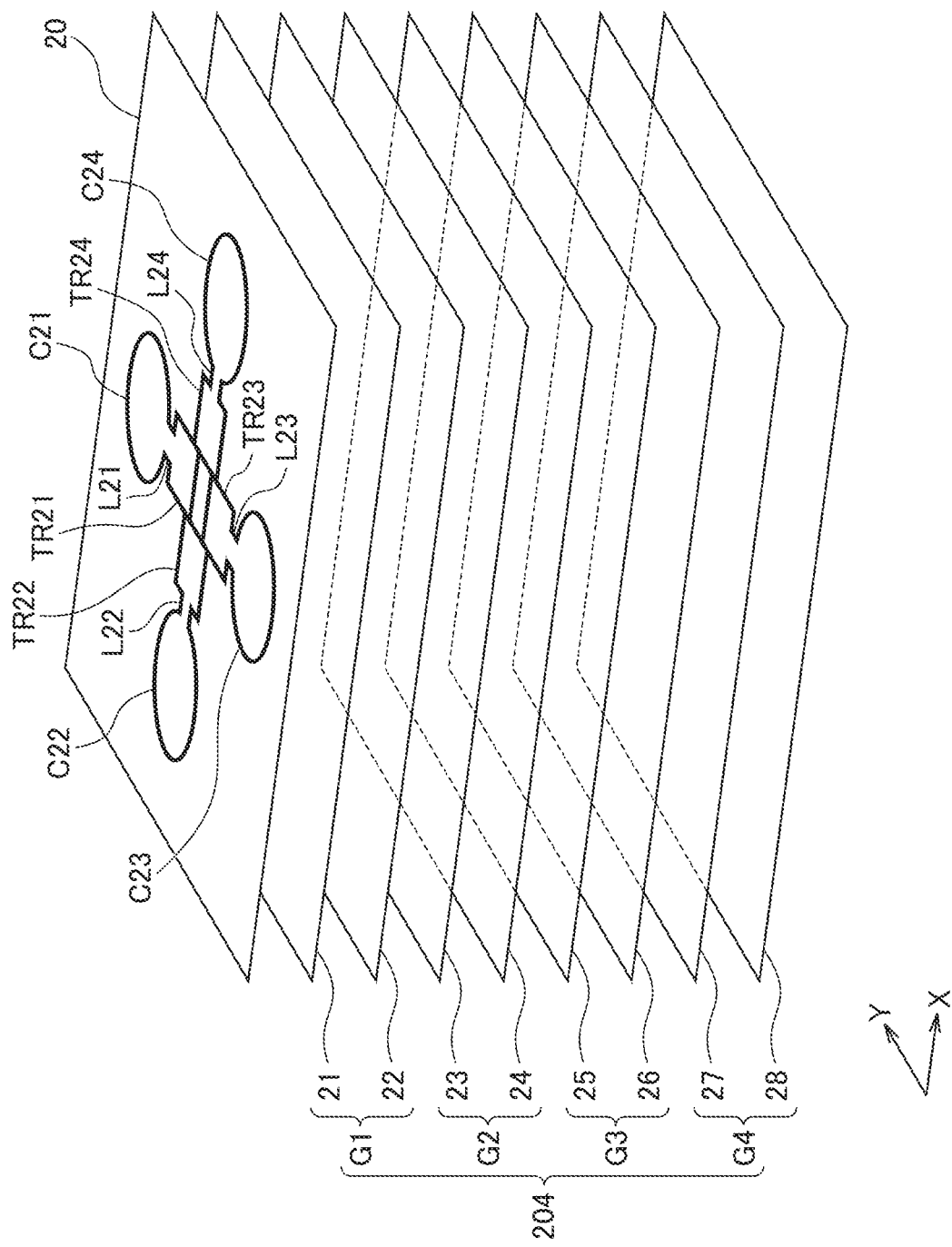
FIG. 8 is a perspective view schematically illustrating the structure of an interposer and a laminated DRAM in Embodiment 3.

FIG. 8 is a perspective view schematically illustrating the structure of an interposer 20 and a laminated DRAM 204. In FIG. 8, the laminated DRAM 204 includes memory chips 21 to 28 of eight DRAMs. However, the number of memory chips laminated is not limited thereto.

In FIG. 8, the interposer 20 includes transmission/reception coils C21 to C24, lead-out lines L21 to L24 that are led out from both ends of each of the transmission/reception coils, and transmission/reception circuits TR21 to TR24 that are connected to the lead-out lines. Signals are input and output between the transmission/reception circuits TR21 to TR24 and the transmission/reception coils C21 to C24. The components have the same structures as the transmission/reception coils C1 to C4, the lead-out lines L1 to L4, and the transmission/reception circuits TR1 to TR4 of the interposer 3 described in Embodiment 1. The transmission/reception coils C21 to C24 are a preferred example of the second transmission/reception coil according to the invention. The lead-out lines L21 to L24 are a preferred example of the second lead-out line according to the invention. The transmission/reception circuits TR21 to TR24 are a preferred example of the second transmission/reception circuit according to the invention.

All of transmission/reception coils, lead-out lines, and transmission/reception circuits provided in the memory chips 21 to 28 are not illustrated in FIG. 8 and have the same structures as those of the memory chips 11 to 14 described with reference to FIG. 2 in Embodiment 1. That is, the same transmission/reception coils, lead-out lines, and transmission/reception circuits as those in the memory chip 11 are provided in the memory chips 21 and 22. The same transmission/reception coils, lead-out lines, and transmission/reception circuits as those in the memory chip 12 are provided in the memory chips 23 and 24. The same transmission/reception coils, lead-out lines, and transmission/reception circuits as those in the memory chip 13 are provided in the memory chips 25 and 26. The same transmission/reception coils, lead-out lines, and transmission/reception circuits as those in the memory chip 14 are provided in the memory chips 27 and 28. The disposition relationship between the memory chips 21 to 28 and the interposer 20 is the same as that in FIG. 2.

As such, this embodiment differs from Embodiment 1 in that it includes a plurality of memory chips having the same disposition of the transmission/reception coils, the lead-out lines, and the transmission/reception circuits. Specifically, the memory chips 21 to 28 forming the laminated DRAM 204 are divided into four (a plurality of) group units and the transmission/reception coils, the lead-out lines, and the transmission/reception circuits of the memory chips forming each of group units G1 to G4 are disposed at positions that overlap each other in a plan view. That is, in FIG. 8, the disposition of the transmission/reception coils, the lead-out lines, and the transmission/reception circuits of the memory chip 22 forming the group G1 is the same as the disposition of those of the memory chip 21 forming the group G1. Similarly, the memory chips 23 and 24 forming the group G2 have the same disposition of the transmission/reception coils, the lead-out lines, and the transmission/reception circuits. The memory chips 25 and 26 forming the group G3 have the same disposition of the transmission/reception coils, the lead-out lines, and the transmission/reception circuits. The memory chips 27 and 28 forming the group G4 have the same disposition of the transmission/reception coils, the lead-out lines, and the transmission/reception circuits. According to this configuration, it is not necessary to dispose the transmission/reception coils, the lead-out lines, and the transmission/reception circuits in different ways in each memory chip. Therefore, it is possible to easily switch between a product in which four DRAM memory chips are laminated and a product in which eighth DRAM memory chips are laminated and to simplify a semiconductor device manufacturing process.

FIGS. 9(A) to 9(D) are partial plan views schematically illustrating the memory chips 21 to 28. FIGS. 9(A) to 9(D) illustrate transmission/reception coils C221 to C228 provided in the memory chips 21 to 28, lead-out lines L221 to L228 led out from both ends of each of the transmission/reception coils, and transmission/reception circuits TR221 to TR228 that are connected to the lead-out lines. Signals are input and output between the transmission/reception circuits TR221 to TR228 and the transmission/reception coils C221 to C228. Here, the transmission/reception coils C221 to C228 are a preferred example of the first transmission/reception coil according to the invention. The lead-out lines L221 to L228 are a preferred example of the first lead-out line according to the invention. The transmission/reception circuits TR221 to TR228 are a preferred example of the first transmission/reception circuit according to the invention.

Figure 9A:
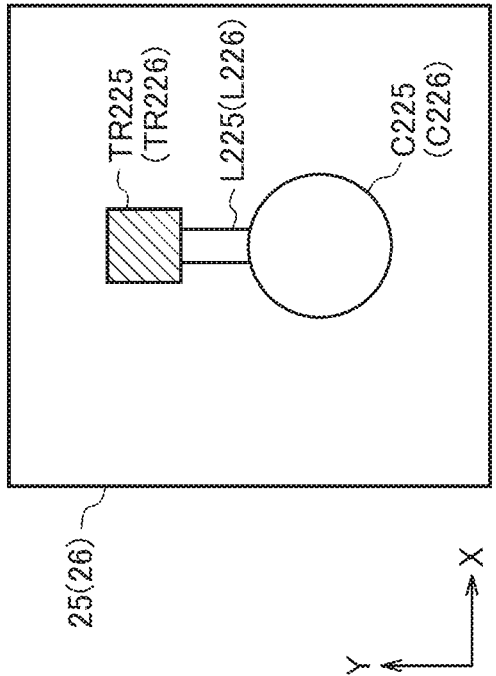
FIGS. 9(A) to 9(D) are partial plan views schematically illustrating memory chips in Embodiment 3.
Figure 9C:
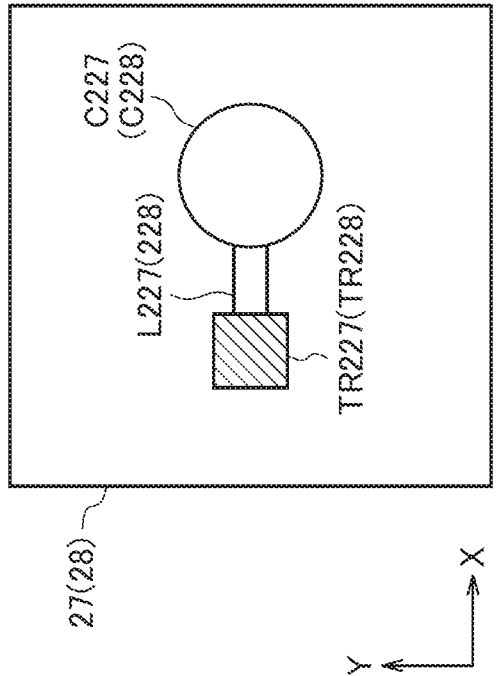

In the memory chip 21 (22) illustrated in FIG. 9(A), the transmission/reception coil C221 (C222) and the transmission/reception circuit TR221 (TR222) are arranged in the Y direction. The memory chip 25 (26) illustrated in FIG. 9(C) has the same structure as the memory chip 21 (22) except that the positional relationship between the transmission/reception coil C225 (C226) and the transmission/reception circuit TR225 (TR226) is 180 degrees different from that illustrated in FIG. 9(A).

Figure 9B:
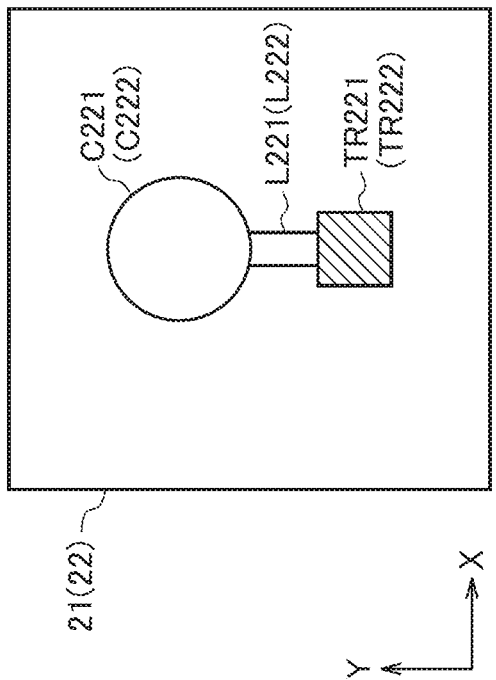
Figure 9D:
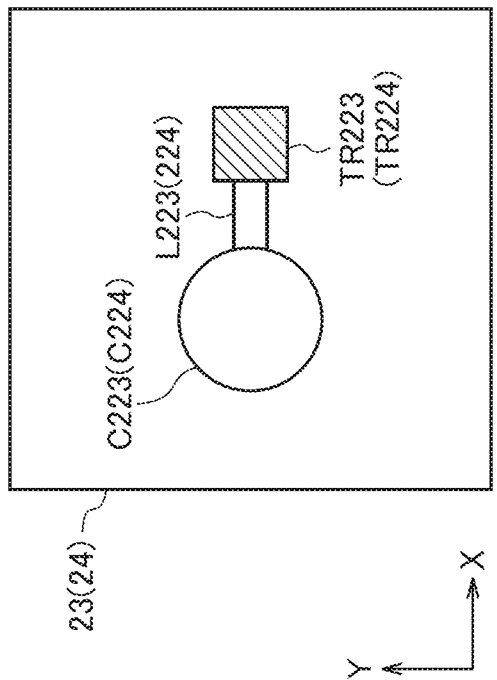

In the memory chip 23 (24) illustrated in FIG. 9(B), the transmission/reception coil C223 (C224) and the transmission/reception circuit TR223 (TR224) are arranged in the X direction. The memory chip 27 (28) illustrated in FIG. 9(D) has the same structure as the memory chip 23 (24) except that the positional relationship between the transmission/reception coil C227 (C228) and the transmission/reception circuit TR227 (TR228) is 180 degrees different from that illustrated in FIG. 9(B).

In the laminated DRAM 204, the memory chips 21 to 28 are laminated such that the transmission/reception circuits TR221 to TR228 overlap each other in a plan view. That is, the transmission/reception circuits TR221 to TR228 are disposed at a common position in the memory chips 21 to 28. This floor plan of the semiconductor device makes it possible to provide a large number of transmission/reception circuits and the transmission/reception coils C221 to C228 in the memory chips 21 to 28 with high efficiency. Therefore, it is possible to reduce the size of the semiconductor device and to increase the degree of integration of the semiconductor device.

According to this structure, in the plan view of the laminated DRAM 204, the transmission/reception coils C221 to C228 are disposed in the vicinity of the transmission/reception circuits TR221 to TR228 which overlap each other at the positions that do not overlap each other. In this case, it is preferable that the transmission/reception coils C221 to C228 be symmetrically disposed in a plan view, similarly to Embodiment 1. Since the transmission/reception coils C221 (C222) to C227 (C228) are disposed at the positions that do not overlap each other, the distance between the coils is long. Therefore, it is possible to reduce a received voltage of crosstalk in each transmission/reception coil and to prevent a signal voltage received from the corresponding transmission/reception coil of the interposer 20 from being affected by the received voltage. In addition, in a case in which the transmission/reception coils C221 (C222) to C227 (C228) are symmetrically disposed in a plan view, it is possible to provide a large number of transmission/reception coils which are not limited to the transmission/reception coils C221 to C228 in each of the memory chips 21 to 28 with high efficiency.

It is preferable that the lengths of the lead-out lines L221 to L228 illustrated in FIGS. 9(A) to 9(D) be equal to each other. In a case in which the lengths of the lead-out lines L221 to L228 are different from each other, the resistance values of the lead-out lines L221 to L228 are different from each other, which causes a difference between the degrees of attenuation of the signals input and output between the transmission/reception coils C221 to C228 and the transmission/reception circuits TR221 to TR228. In a case in which the lengths of the lead-out lines L221 to L228 are equal to each other, it is possible to input and output signals with the same level in any combination of the transmission/reception coils and the transmission/reception circuits.

Figure 10:
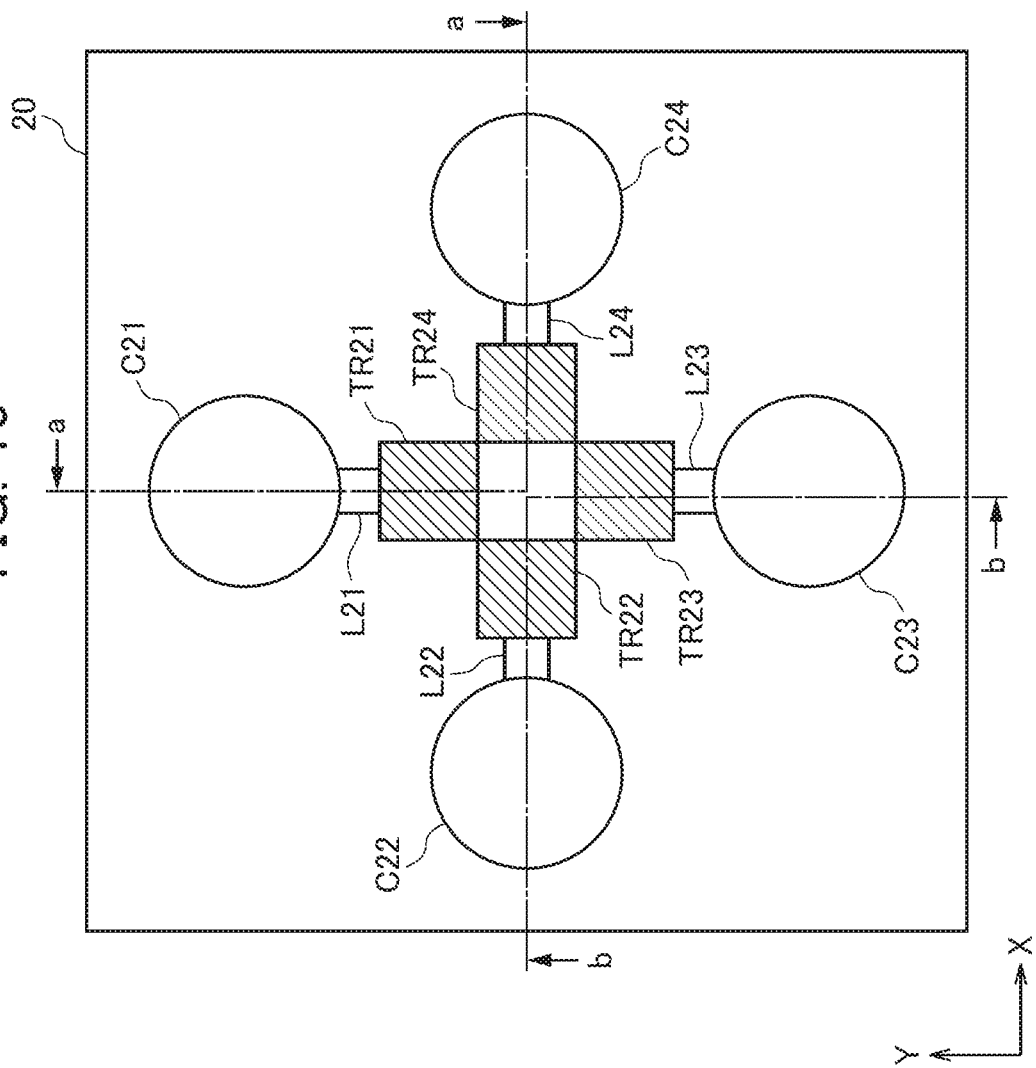
FIG. 10 is a partial plan view schematically illustrating an interposer in Embodiment 3.

FIG. 10 is a partial plan view schematically illustrating the interposer 20. In FIG. 10, in a case in which the transmission/reception coil C21, the lead-out line L21, and the transmission/reception circuit TR21 form a group and the other transmission/reception coils C22 to C24, the other lead-out lines L22 to L24, and the other transmission/reception circuits TR22 to TR24 are grouped in the same way, it is possible to form four groups of the transmission/reception coils, the lead-out lines, and the transmission/reception circuits. The components are disposed on the circumference of a circle with an appropriate size (which is the same as the circle 10 illustrated in FIG. 5) such that the transmission/reception circuits TR21 to TR24 are symmetrically disposed inside the circle and the transmission/reception coils C21 to C24 are symmetrically disposed outside the circle as illustrated in FIG. 10.

It is preferable that the lead-out lines L21 to L24 of the interposer 20 have the same length. In a case in which the lead-out lines L21 to L24 have different lengths, the resistance values of the lead-out lines L21 to L24 are different from each other, which causes a difference between the degrees of attenuation of the signals input and output between the transmission/reception coils C21 to C24 and the transmission/reception circuits TR21 to TR24. In a case in which the lengths of the lead-out lines L21 to L24 are equal to each other, it is possible to input and output signals with the same level in any combination of the transmission/reception coils and the transmission/reception circuits.

Figure 11:
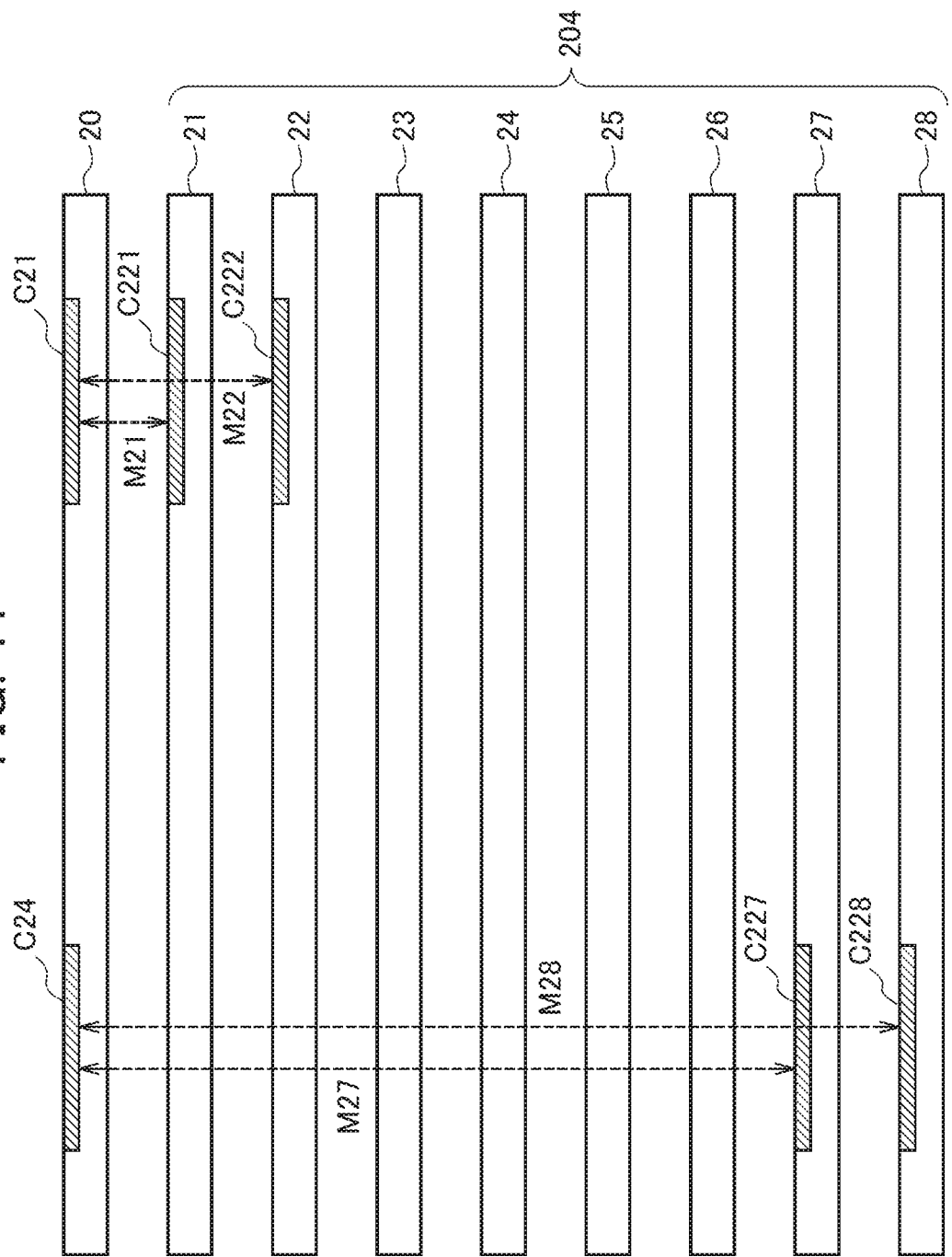
FIG. 11 is a cross-sectional view schematically illustrating the projection of the line a-a of FIG. 10 to memory chips illustrated in FIG. 8.

FIG. 11 is a diagram schematically illustrating the cross-sectional configuration of the interposer 20 and the laminated DRAM 204 in a case in which the line a-a of FIG. 10 is projected to the memory chips 21 to 28 illustrated in FIG. 8. FIG. 11 illustrates only the transmission/reception coils for description.

As illustrated in FIG. 11, electromagnetic coupling is generated between the transmission/reception coil C21 and the transmission/reception coil C221 and between the transmission/reception coil C21 and the transmission/reception coil C222 by magnetic fluxes M21 and M22 represented by arrows in FIG. 11. It is preferable that the transmission/reception coil C21 of the interposer 20 be disposed such that the central axis thereof is aligned with the central axes of the transmission/reception coil C221 of the memory chip 21 and the transmission/reception coil C222 of the memory chip 22 as illustrated in FIG. 11.

In addition, electromagnetic coupling is generated between the transmission/reception coil C24 and the transmission/reception coil C227 and between the transmission/reception coil C24 and the transmission/reception coil C228 by magnetic fluxes M27 and M28 represented by arrows in FIG. 11. It is preferable that the transmission/reception coil C24 of the interposer 20 be disposed such that the central axis thereof is aligned with the central axes of the transmission/reception coil C227 of the memory chip 27 and the transmission/reception coil C228 of the memory chip 28.

Figure 12:
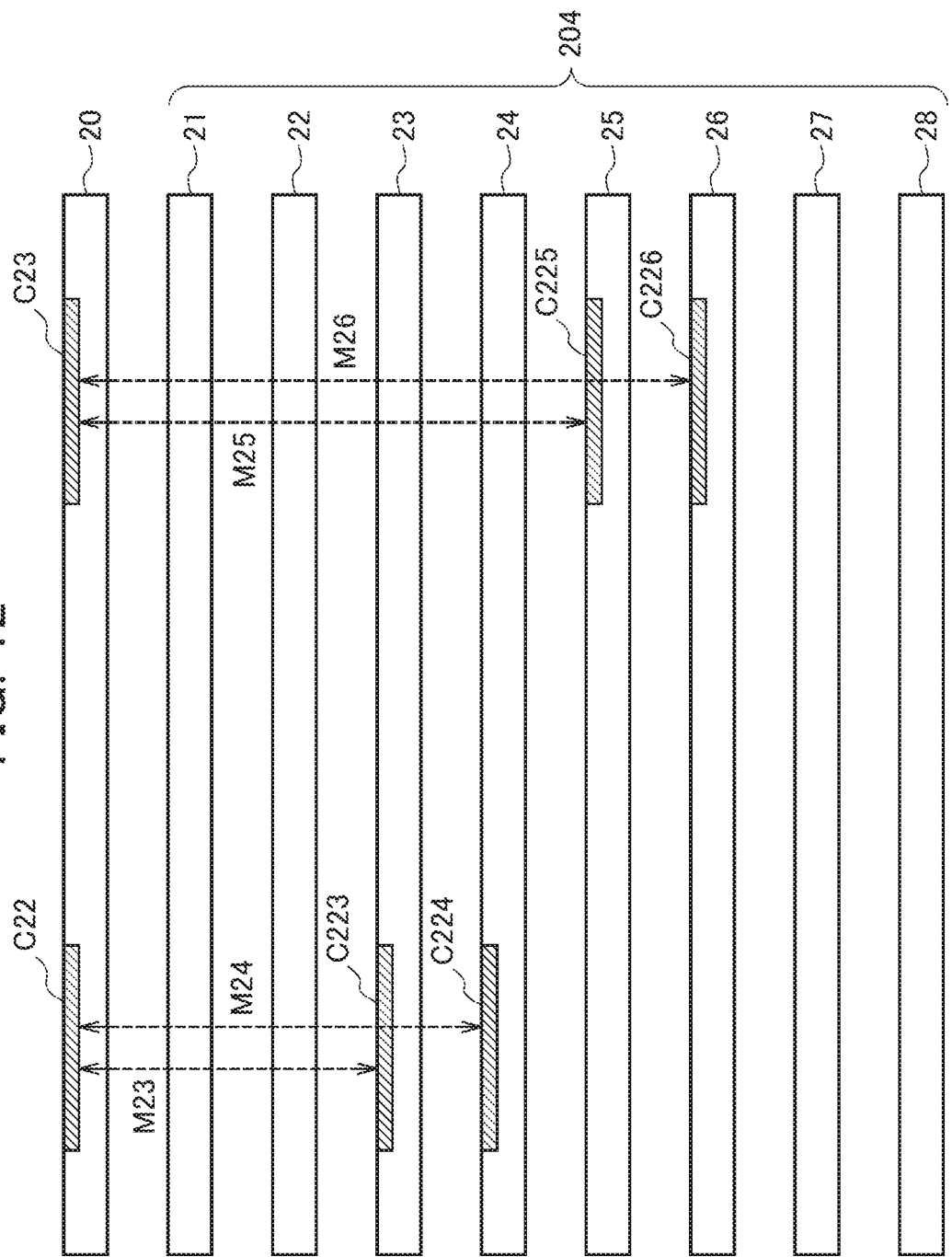
FIG. 12 is a cross-sectional view schematically illustrating the projection of the line b-b of FIG. 10 to the memory chips illustrated in FIG. 8.

FIG. 12 is a diagram schematically illustrating the cross-sectional configuration of the interposer 20 and the laminated DRAM 204 in a case in which the line b-b of FIG. 10 is projected to the memory chips 21 to 28 illustrated in FIG. 8. FIG. 12 illustrates only the transmission/reception coils for description.

As illustrated in FIG. 12, electromagnetic coupling is generated between the transmission/reception coil C22 and the transmission/reception coil C223 and between the transmission/reception coil C22 and the transmission/reception coil C224 by magnetic fluxes M23 and M24 represented by arrows in FIG. 12. It is preferable that the transmission/reception coil C22 of the interposer 20 be disposed such that the central axis thereof is aligned with the central axes of the transmission/reception coil C223 of the memory chip 23 and the transmission/reception coil C224 of the memory chip 24 as illustrated in FIG. 12.

In addition, electromagnetic coupling is generated between the transmission/reception coil C23 and the transmission/reception coil C225 and between the transmission/reception coil C23 and the transmission/reception coil C226 by magnetic fluxes M25 and M26 represented by arrows in FIG. 12. It is preferable that the transmission/reception coil C23 of the interposer 20 be disposed such that the central axis thereof is aligned with the central axes of the transmission/reception coil C225 of the memory chip 25 and the transmission/reception coil C226 of the memory chip 26.

As such, since the central axes of the transmission/reception coils C21 to C24 of the interposer 20 are aligned with the central axes of the transmission/reception coils C221 (C222) to C227 (C228) of the corresponding memory chips 21 to 28, it is possible to prevent a communication failure caused by the attenuation of the signals transmitted and received between the coils. In addition, it is possible to prevent an increase in power required for communication.

In FIGS. 8 and 10, the transmission/reception circuits TR21 to TR24 of the interposer 20 are disposed at the positions that do not overlap each other. However, this embodiment is not limited thereto. For example, one transmission/reception circuit may be provided at the center of the circle and the transmission/reception circuit may have four circuit portions corresponding to the transmission/reception coils C21 to C24 and a circuit portion common to the transmission/reception coils C21 to C24.

For example, data communication between the interposer 20 and the laminated DRAM 204 including a plurality of memory chips having the same disposition of the transmission/reception coils, the lead-out lines, and the transmission/reception circuits can be performed as follows.

Figure 13:
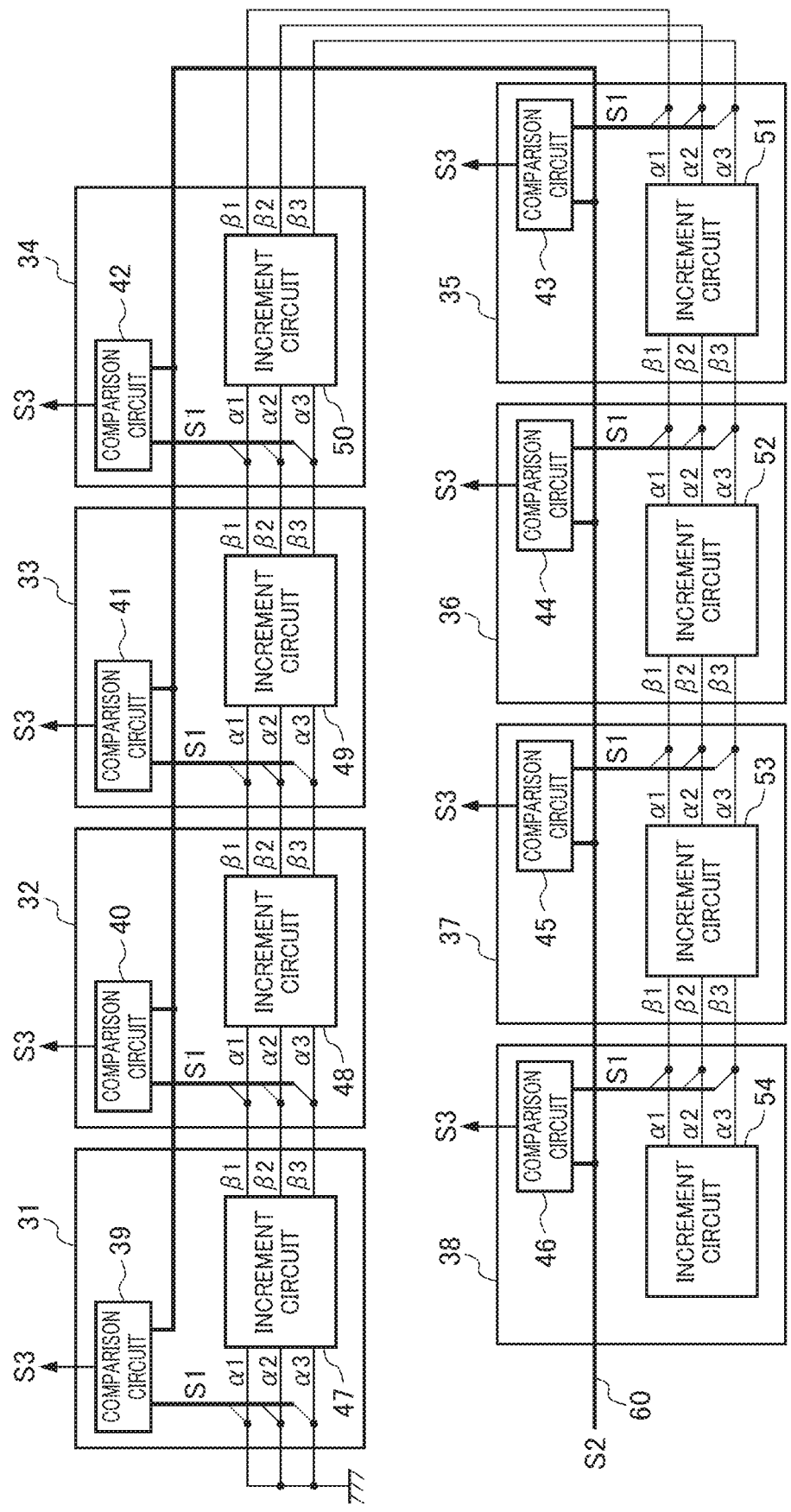
FIG. 13 is a diagram illustrating the configuration of a chip selection circuit in Embodiment 3.

The memory chips 21 to 28 may include memory circuits and chip selection circuits 31 to 38 illustrated in FIG. 13, respectively.

As illustrated in FIG. 13, the chip selection circuits 31 to 38 are connected to each other and generate identification numbers S1 to be given to the corresponding memory chips. In addition, the chip selection circuits 31 to 38 compare a chip selection address S2 which has been input from the outside through the interposer 20 and a common signal line 60 with the chip identification number S1 and output a chip selection signal S3. The interposer 20 may have a function of generating the address S2 and outputting the address S2.

The chip selection circuits 31 to 38 include arithmetic circuits that output different identification numbers S1 to the memory chips 21 to 28 and comparison circuits 39 to 46 that compare the identification number S1 with the address S2 and output the chip selection signal S3, respectively. In FIG. 13, the arithmetic circuits are 3-bit increment circuits 47 to 54 that perform an increment operation of adding 1 to an input value.

In the chip selection circuit 31, all of 3 bits $\alpha 1$, $\alpha 2$, and $\alpha 3$ forming an identification number SN are connected to the ground. Therefore, 0 is input to the increment circuit 47 and 0 is given as the identification number S1 to the memory chip 21. Since a value obtained by adding 1 to 0 is input from the increment circuit 47 to the chip selection circuit 32, the identification number of the memory chip 22 is 1. Therefore, 1 is input to the increment circuit 48 and a value obtained by adding 1 to 1, that is, 2 is output from the increment circuit 48. Similarly, identification numbers 2 to 7 are given to the memory chips 23 to 28, respectively.

Each of the increment circuits 47 to 54 includes 3 1-bit increment circuits to perform a 3-bit increment operation. 3 bits $\alpha 1$, $\alpha 2$, and $\alpha 3$ forming the chip identification number are input to the 1-bit increment circuits and 3 bits $\beta 1$, $\beta 2$, and $\beta 3$ are output from the 1-bit increment circuits.

Each of the comparison circuits 39 to 46 includes three EXOR circuits and one AND circuit. The bit $\alpha 1$ of the identification number S1 and a bit $\gamma 1$ of the address S2 are input to one EXOR circuit. The bit $\alpha 2$ of the identification number S1 and a bit $\gamma 2$ of the address S2 are input to another EXOR circuit. The bit $\alpha 3$ of the identification number S1 and a bit $\gamma 3$ of the address S2 are input to the other EXOR circuit. Each EXOR circuit outputs 0 in a case in which the input bits are not matched with each other and outputs 1 in a case in which the input bits are matched with each other. The values output from the three EXOR circuits are input to the AND circuit. In a case in which all of the three EXOR circuits detect that the input bits are matched with each other, the AND circuit outputs 1 and the chip selection signal S3 is high. On the other hand, in a case in which any one of the three EXOR circuits detects that the input bits are not matched with each other, the AND circuit outputs 0 and the chip selection signal S3 is low.

According to the above-mentioned configuration, even in a case in which a plurality of memory chips having the same disposition of the transmission/reception coils, the lead-out lines, and the transmission/reception circuits are provided, it is possible to select a desired memory chip and to perform data communication between the selected memory chip and the interposer. The configuration of the chip selection circuit is not limited to that illustrated in FIG. 13. Other known configurations may be used as long as a specific memory chip can be selected from the memory chips with the same capacity and configuration.

The invention is not limited to each of the above-described embodiments and can be modified in various ways without departing from the scope and spirit of the invention.

In each of the above-described embodiments, portions which are not directly required for the description of the invention, such as a device configuration and a control method, have not been described. However, a device configuration or a control method required for the semiconductor device may be appropriately selected and used. In addition, all of the semiconductor devices which include the elements of the invention and whose design can be appropriately changed by those skilled in the art are included in the scope of the invention.

EXPLANATION OF REFERENCE NUMERALS 1, 101 SEMICONDUCTOR DEVICE
2, 102 PROCESSOR
3, 20 INTERPOSER
4, 104, 204 LAMINATED DRAM
5, 105 SUBSTRATE
6, 106 SOLDER BALL
11 to 14, 21 to 28, 111 MEMORY CHIP

The invention claimed is:

1. A semiconductor device comprising;
a substrate,
a processor connected to one side of the substrate electrically, and
a first memory chip disposed on one side of the substrate, wherein one portion of the first memory chip is disposed between the processor and the substrate, wherein the first memory chip has a function of a memory chip and a function of an interposer, and in contact with the processor.

2. The semiconductor device described in claim 1 further comprising;
a structure disposed between one side of the substrate and the first memory chip, wherein the structure has a second memory chip laminated on the first memory chip.

3. The semiconductor device described in claim 2, wherein the processor is electrically connected to the second memory chip through the first memory chip.

4. The semiconductor device described in claim 3, wherein the first memory chip sends data received from the processor to the predetermined second memory chip, and sends data received from the predetermined second memory chip to the processor.

5. The semiconductor device described in claim 4, wherein the sending and receiving data between the first memory chip and the second memory chip are executed by a transmission/reception coil for transmitting with inductive coupling.

6. The semiconductor device described in claim 2, wherein the first memory chip and the second memory chip are laminated by fusion bonding, an adhesive, surface-activated room-temperature bonding, or combination any of those.

7. The semiconductor device described in claim 2, wherein the structure is disposed between the processor and the substrate in any part, and the plurality of the structure are surrounding the processor.

* * * * *